(12) United States Patent
Tomasz (10) Patent No.: US 6,400,416 B1
(45) Date of Patent: Jun. 4, 2002

(54) SINGLE-CHIP DIGITAL CABLE TV/CABLE MODEM TUNER IC

(75) Inventor: Martin Tomasz, San Francisco, CA (US)

(73) Assignee: Maxim Integrated Products, Sunnyvale, CA (US)

(*) Notice: Subject to any disclaimer, the term of this patent is extended or adjusted under 35 U.S.C. 154(b) by 0 days.

(21) Appl. No.: 09/289,432

(22) Filed: Apr. 9, 1999

(51) Int. Cl.[7] .............................. H04N 9/64; H04N 7/16
(52) U.S. Cl. ....................................... 348/654; 725/151
(58) Field of Search ......................... 725/151; 348/731, 348/654; 455/130

(56) References Cited

U.S. PATENT DOCUMENTS

| | | | |
|---|---|---|---|
| 3,780,219 A | * 12/1973 | O'Toole | ..................... 348/654 |
| 5,737,035 A | 4/1998 | Rotzoll | |
| 2001/0007151 A1 | * 7/2001 | Vorenkamp et al. | ........ 725/151 |

* cited by examiner

*Primary Examiner*—William Cumming
(74) *Attorney, Agent, or Firm*—Oppenheimer Wolff & Donnelly, LLP (57) ABSTRACT

A television receiver is provided including a first mixer having a first input adapted for receiving an input signal in a predetermined frequency range. It should be noted that the input signal may take the form of either a broadcast television signal, a cable television signal, or a digital signal transmitted over a cable delivery system. The first mixer further includes a second input adapted for receiving a first reference signal having a first operating frequency. In use, the first mixer is suitable for outputting an intermediate frequency signal having a frequency greater than at least one frequency in the predetermined frequency range. Also included is a filter for filtering the intermediate frequency signal. A phase shifting network is provided which includes an input adapted for receiving a second reference signal having a second operating frequency. The phase shifting network further includes a pair of outputs. In operation, the phase shifting network is suitable for outputting a pair of quadrature reference signals each having a frequency substantially equal to the second operating frequency. A pair of second mixers each have a first input coupled to the filter and a second input coupled to one of the outputs of the phase shifting network. The second mixer serves for generating output signals that are in quadrature and at a baseband frequency. A pair of low-pass filters are coupled to the second mixers for filtering the output signals.

52 Claims, 10 Drawing Sheets

SINGLE-CHIP DIGITAL CABLE TV/CABLE MODEM TUNER IC

DESCRIPTION

1. Technical Field

The present invention relates to television tuners and more particularly pertains to a highly integrated television tuner fabricated on a single microcircuit device.

2. Background Art

In the past, television tuners have been constructed to be fairly complex and typically include between 100 and 200 elements on a circuit board. One example of a prior art tuner is shown in Prior Art FIG. 1. In such Figure, a tuner 100 is shown to include, at the most basic level, an upconverter 102, an upconverter output circuit 104, an intermediate filter circuit 106, a downconverter 108, and an output filter 110.

Figure 1:
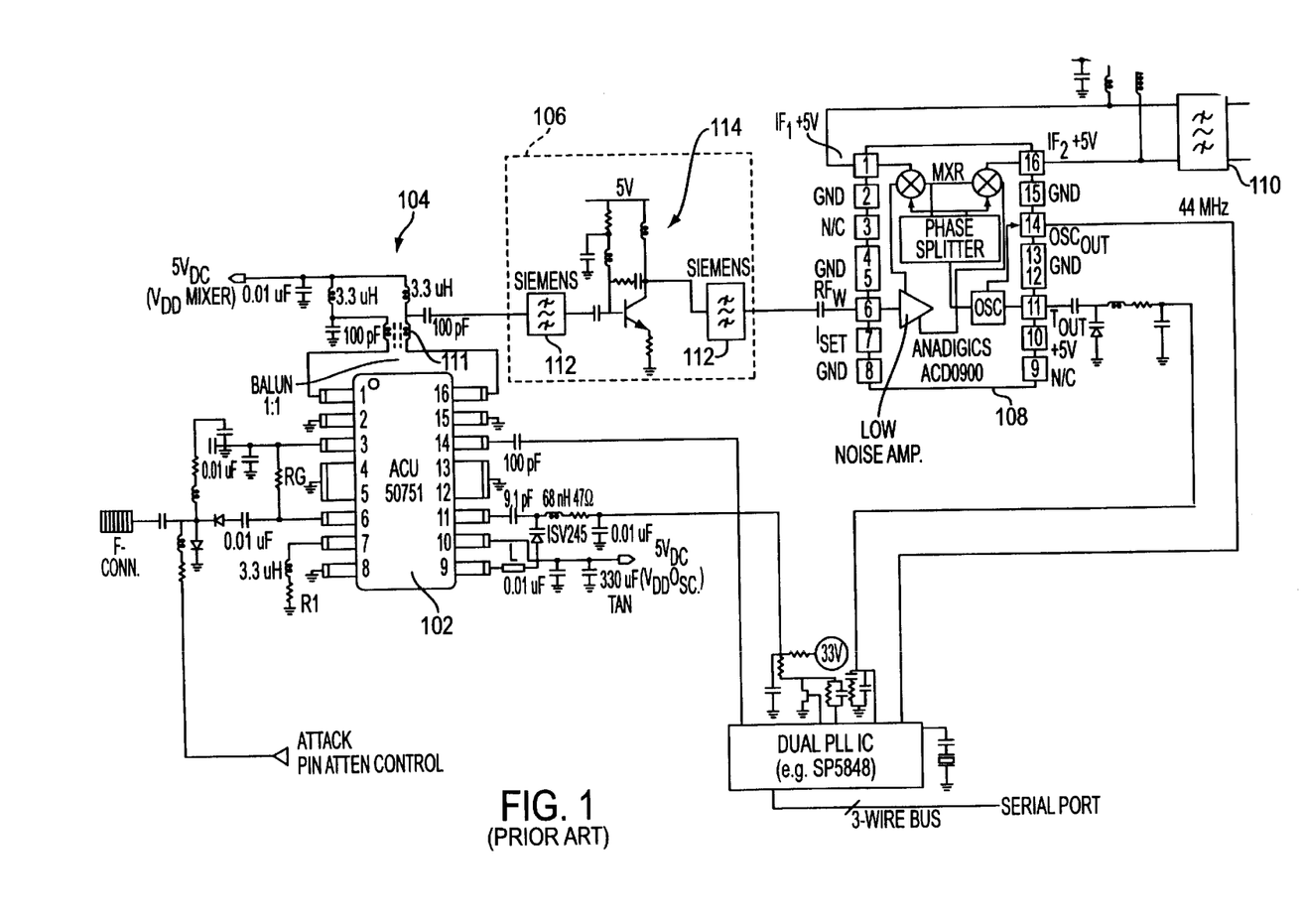
FIG. 1 is a schematic diagram of a television receiver of the prior art.

The upconverter 102 takes the form of an integrated circuit, i.e. ACU50751. In use, the upconverter 102 mixes an input signal with a reference signal to generate an intermediate frequency signal. Typically, such intermediate frequency signal is in the order of 1.2 GHz. Connected to the upconverter 102 is the output circuit 104 which includes a balun 111, or balancing transformer, for converting the intermediate frequency signal from the upconverter 102 to a single-ended form.

The downconverter 108 of the tuner 100 is connected to the upconverter output circuit 104 with the intermediate filter circuit 106 connected therebetween. Finally, the output filter 110 is connected to the downconverter 108 for filtering purposes. During operation, the downconverter 108 mixes the intermediate frequency signal with a reference signal to generate a second intermediate frequency signal usually in the order of 44 or 36 MHz.

Due to the specific values of the first and second intermediate frequency signals, image frequencies are generated at 1.2 GHz+/−88 or 72 MHz. These image frequencies, in turn, require complex filtering. For example, intermediate filter circuit 106 requires a pair of filters 112 having an interstage buffer 114. Further, the output filter 110 must consist of an intricate SAW filter or the like.

It should be noted that both of the foregoing filters are extremely difficult, if not impossible, to implement on an integrated circuit in view of high "Q" ratings. As such, the tuner 100 of Prior Art FIG. 1 must be implemented with multiple discrete components. There is thus a need in the prior art for a tuner with simplified filtering requirements and the capability of being implemented on a single integrated circuit.

SUMMARY OF THE INVENTION

A television receiver is provided including a first mixer having a first input adapted for receiving an input signal in a predetermined frequency range. It should be noted that the input signal may take the form of either a broadcast television signal, a cable television signal, or a digital signal transmitted over a cable delivery system. The first mixer further includes a second input adapted for receiving a first reference signal having a first operating frequency. In use, the first mixer is suitable for outputting an intermediate frequency signal having a frequency greater than at least one frequency in the predetermined frequency range. Also included is a filter for filtering the intermediate frequency signal. A phase shifting network is provided which includes an input adapted for receiving a second reference signal having a second operating frequency. The phase shifting network further includes a pair of outputs. In operation, the phase shifting network is suitable for outputting a pair of quadrature reference signals each having a frequency substantially equal to the second operating frequency. A pair of second mixers each have a first input coupled to the filter and a second input coupled to one of the outputs of the phase shifting network. Coupled to the second mixers are a pair of low-pass filters for filtering the output signals. In use, the second mixers serve for generating output signals that are in quadrature and at a baseband frequency for being processed by a subsequent digital signal processor.

By this structure, the stringent requirements associated with filtering the intermediate frequency signal is avoided by downconverting the intermediate frequency signal to a baseband frequency. As such, the filter of the present invention that follows the first mixer may be simplistic in design since image frequencies are not produced. The simplistic nature of the filter in turn allows easier implementation on an integrated circuit with the remaining components of the present invention. Further, the low-pass filters may also be implemented on the integrated circuit since an intricate SAW filter is not required.

BRIEF DESCRIPTION OF THE DRAWINGS

The invention will be better understood when consideration is given to the following detailed description thereof. Such description makes reference to the annexed drawings wherein.

Prior Art

DISCLOSURE OF THE INVENTION

Figure 2:
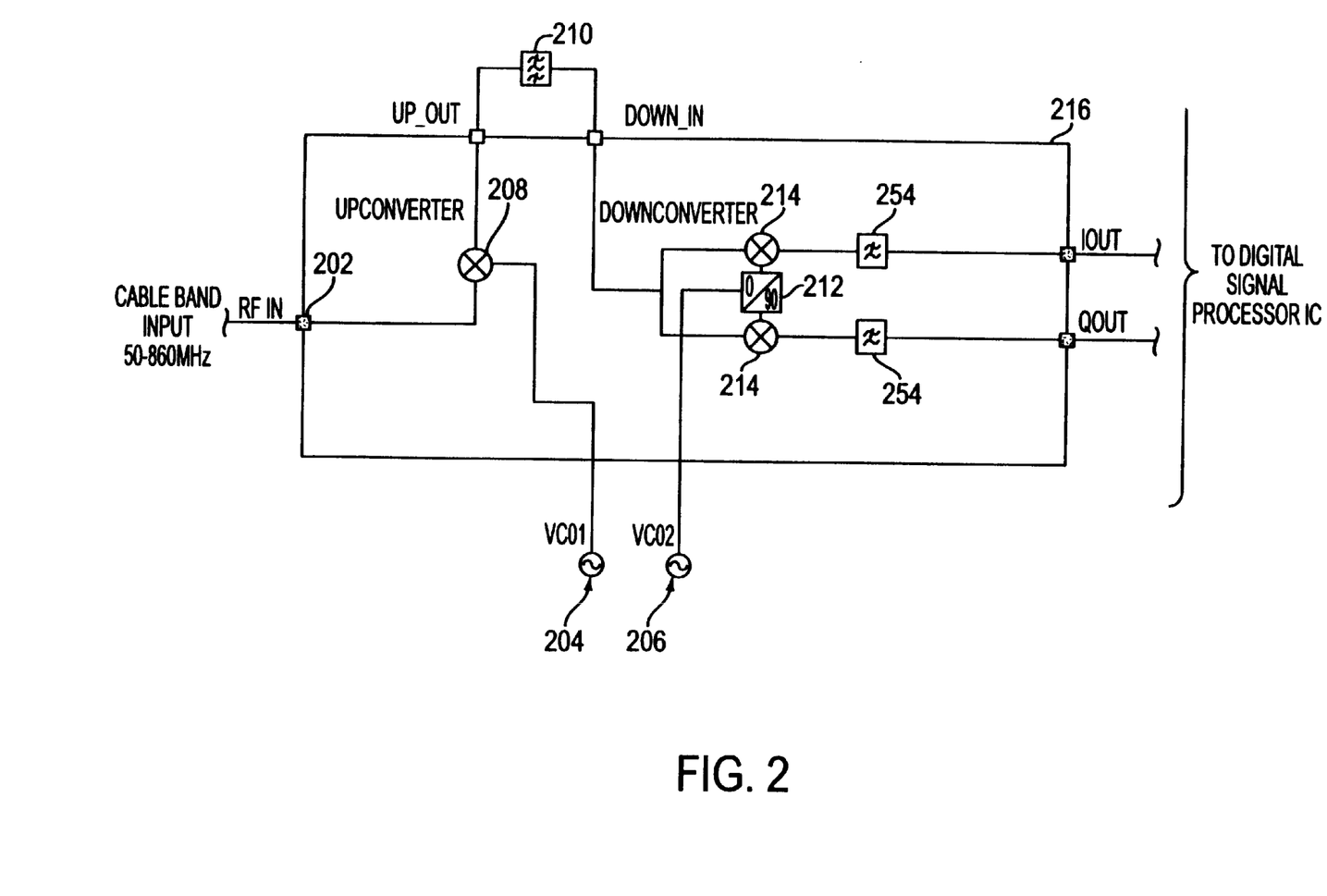
FIG. 2 is a schematic diagram of one embodiment of the present invention.

FIG. 1 shows a prior art television receiver. With reference now to FIG. 2, one embodiment of the present invention is shown to include a receiver 200 having an input 202, first and second reference signal sources 204 and 206, a first mixer 208, a filter 210, a 90° phase shifting network 212, a pair of second mixers 214, and a pair of low-pass filters 254.

Due to relaxed constraints on the filter 210 and low-pass filters 254, such filters may take on a simplistic design and therefore be more easily implemented on a single integrated circuit 216 with the remaining components of the present invention. The foregoing relaxed constraints are afforded by converting the input signal to an intermediate frequency signal and then directly to baseband output signals(as opposed to second intermediate frequency signals of 44 and 36 MHz), thereby avoiding the generation of image frequency signals that traditionally require more intricate filters. As mentioned earlier, these image frequency signals require complex filters with higher "Q" ratings, i.e. SAW filters, which must be implemented separate from the integrated circuit.

With continuing reference to FIG. 2, the input 202 of the present invention is adapted for receiving an input signal within a predetermined radio frequency (RF) range. It should be noted that the input signal may take on any broadcast television signal, cable television signal, or digital signal transmitted on a cable delivery system. Typically such input signal occurs in the frequency range of 50–860 MHz. For reasons that will soon become apparent, the first and second reference signal sources 204 and 206 are capable of generating a first reference signal having a first operating frequency and a second reference signal having a second operating frequency, respectively.

The first mixer 208 has a first input coupled to the input signal and a second input coupled to the first reference signal. In use, the first mixer 208 outputs an intermediate frequency signal having a frequency greater than any other frequency in the predetermined frequency range. Coupled to the first mixer 208 is a filter 210 for filtering the intermediate frequency signal.

FIG. 2 shows the 90° phase shifting network 212 to have an input coupled to the second reference signal. The phase shifting network 212 is further equipped with a pair of outputs. In operation, the phase shifting network 212 is suitable for outputting a pair of quadrature reference signals each having a frequency substantially equal to the second operating frequency.

Coupled to the filter 210 are a pair of second mixers 214. Such second mixers 214 are each further coupled to one of the outputs of the phase shifting network 212. The second mixers 214 serve to generate output signals that are in quadrature and at a baseband frequency.

Through the use of the second mixers 214 and the phase shifting network 212, the present invention is capable of generating output signals that are each at a baseband frequency and in quadrature. The conversion to baseband is critical for simplifying the constraints of the filter 210 and low-pass filters 254 which in turn allows the filter 210 and low-pass filters 254 to be more easily implemented on an integrated circuit 216 along with the remaining components of the receiver 200.

Figure 3:
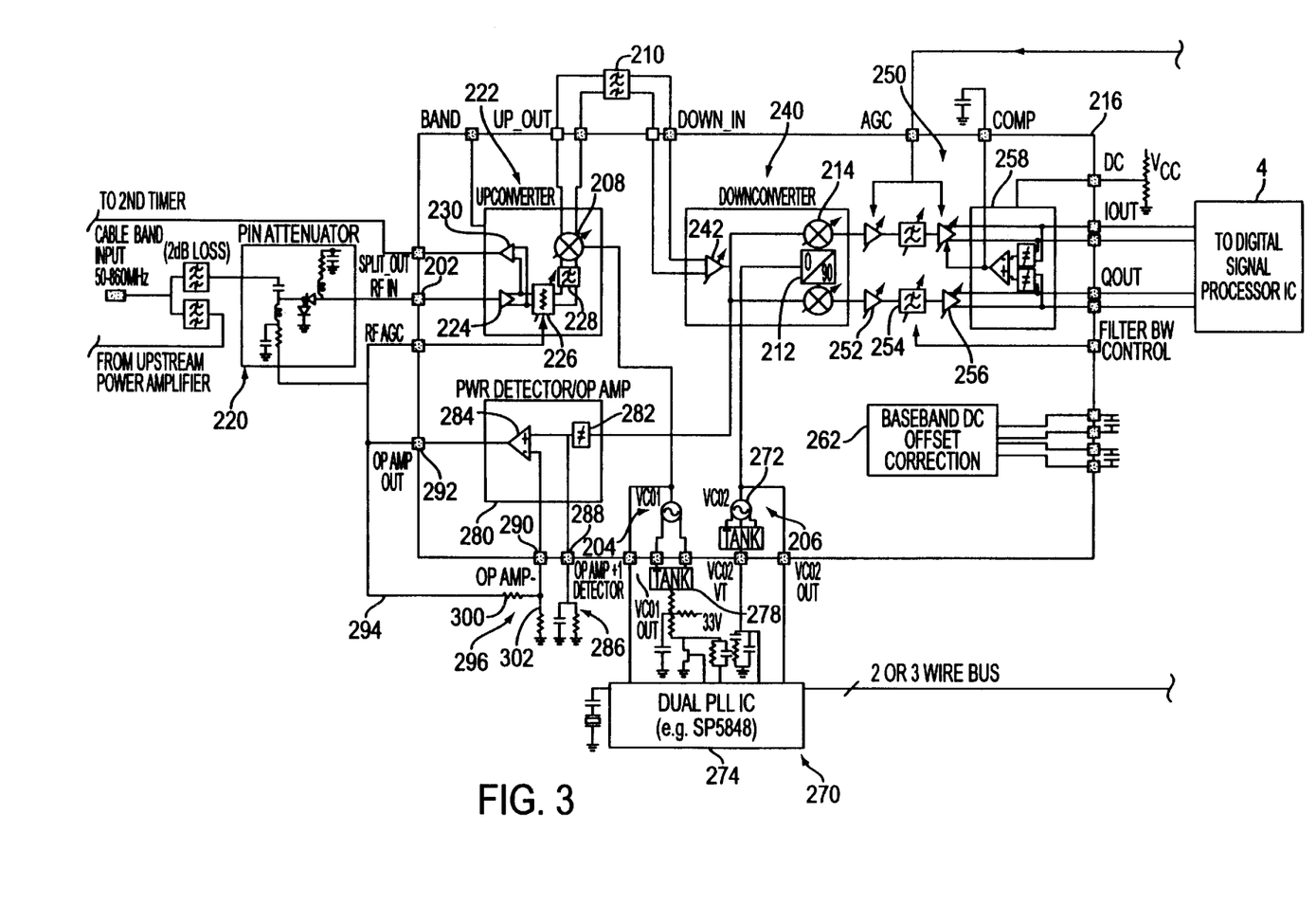
FIG. 3 is a more detailed schematic diagram of one embodiment of the present invention.
Figure 4:
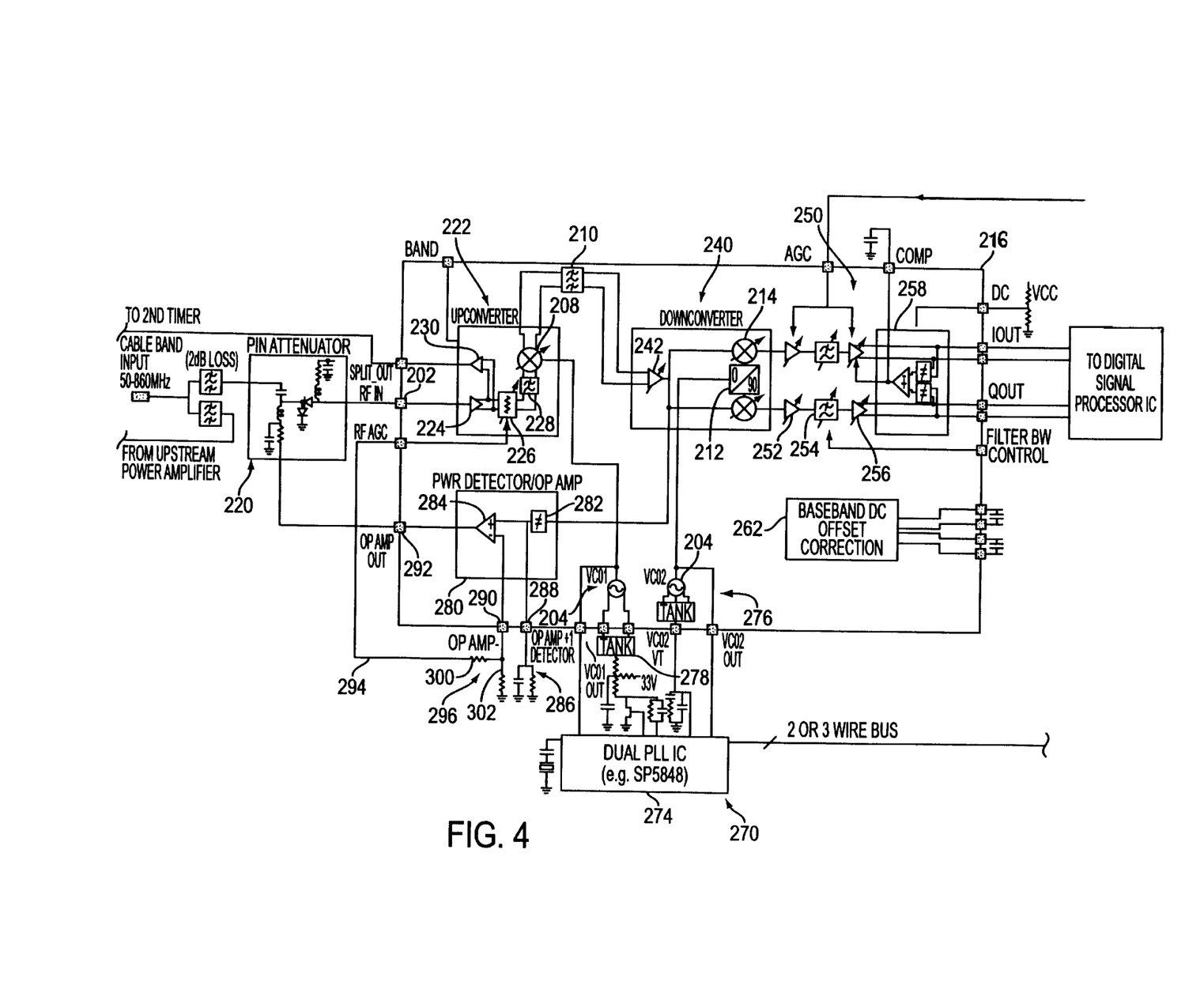
FIG. 4 is a more detailed schematic diagram of one embodiment of the present invention, wherein one of the filters of the present invention is implemented on an integrated circuit chip along with the remaining components of the present invention.
Figure 5:
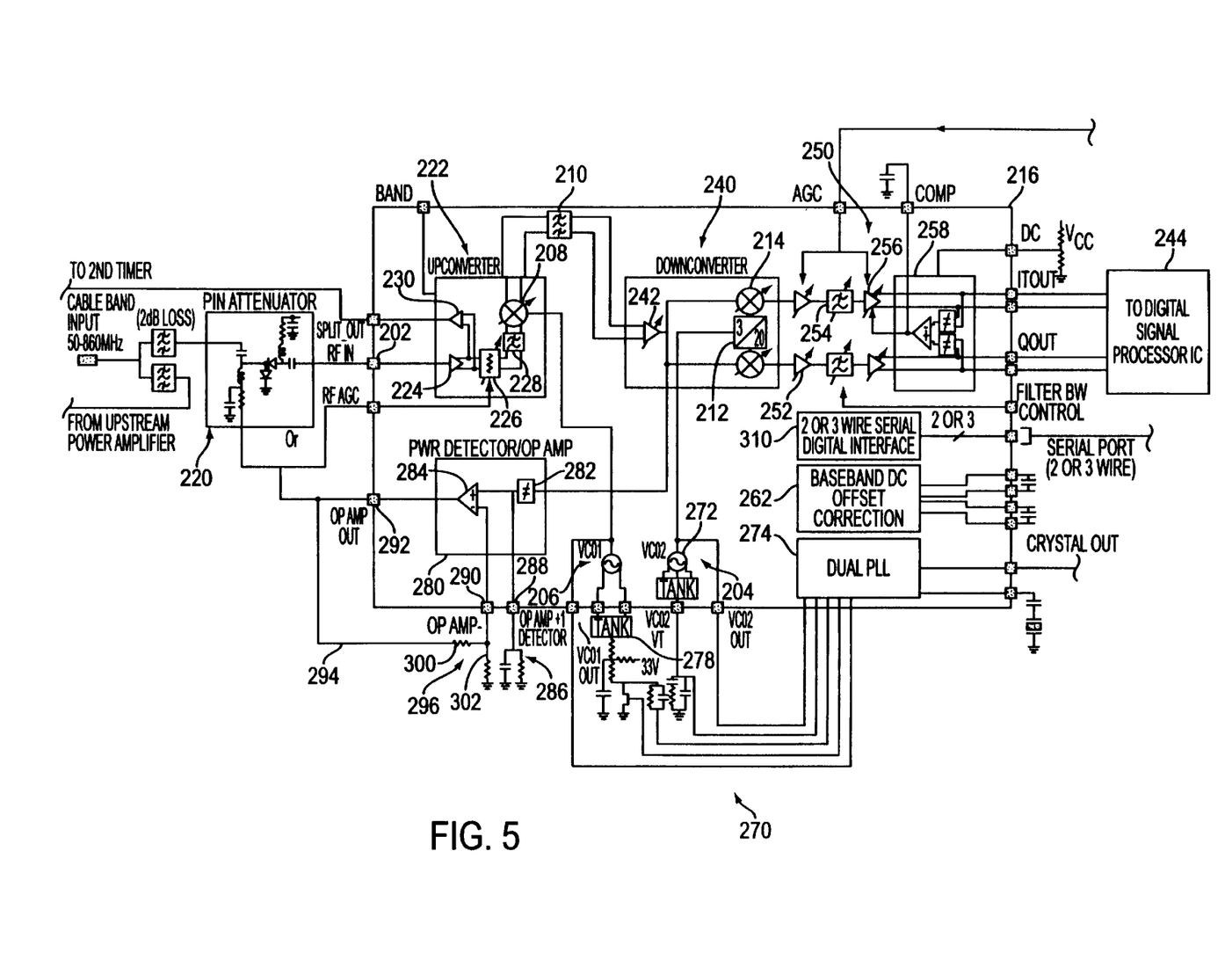
FIG. 5 is a more detailed schematic diagram of one embodiment of the present invention, wherein the frequency synthesizer of the present invention is implemented on an integrated circuit chip along with the remaining components of the present invention.

As shown in FIGS. 3–5, the embodiment of FIG. 2 may be expanded to include a plurality of optional components for the purpose of enhanced operation. For example, a PIN attenuator network 220 may be connected between a source of the input signal and the input 202 of the present invention. As is commonly known in the art, the PIN attenuator network 220 serves to reduce carrier levels during operation.

Further, the first mixer 208 of FIG. 2 may be a component of an upconverter network 222 that further includes a low noise amplifier 224, a variable attenuator 226, and an image filter 228. Note FIGS. 3–5. In such embodiment, an input of the low noise amplifier 224 of the upconverter network 222 is coupled to the input 202. Further, an output of the low noise amplifier 224 of the upconverter network 222 is coupled to an input of the variable attenuator 226. Finally, the image filter 228 of the upconverter network 222 is connected between an output of the variable attenuator 226 and the first input of the first mixer 208. In use, the image filter 228 serves to attenuate image noise which occurs at $2*F_{IF}+F_{desired}$, where IF is the intermediate frequency. This noise, if allowed to enter the first mixer 208, would desensitize it.

In operation, the upconverter network 222 mixes a band of carriers of the input signal to an intermediate frequency (IF) signal which is higher than any of the carrier frequencies of the input signal. In one embodiment, the frequency of the intermediate frequency signal is 1.2 GHz. The first mixer 208 of the upconverter network 222 is driven by the first reference signal which, in one embodiment, is $F_{IF}+F_{IN}$, wherein $F_{IF}$ is the frequency of the intermediate frequency signal and $F_{IN}$ is the frequency of the desired carrier.

As an option, the low noise amplifier 224 of the upconverter network 222 may be connected to a separate additional low noise amplifier 230 for serving as a signal splitter and driving an unillustrated second receiver. Further, the low noise amplifier 224 may take the form of a variable low noise amplifier for adjustably setting a magnitude, or carrier levels, of the input signal. This adjustment may be effected by way of a dedicated external pin of the integrated circuit 216.

Figure 6:
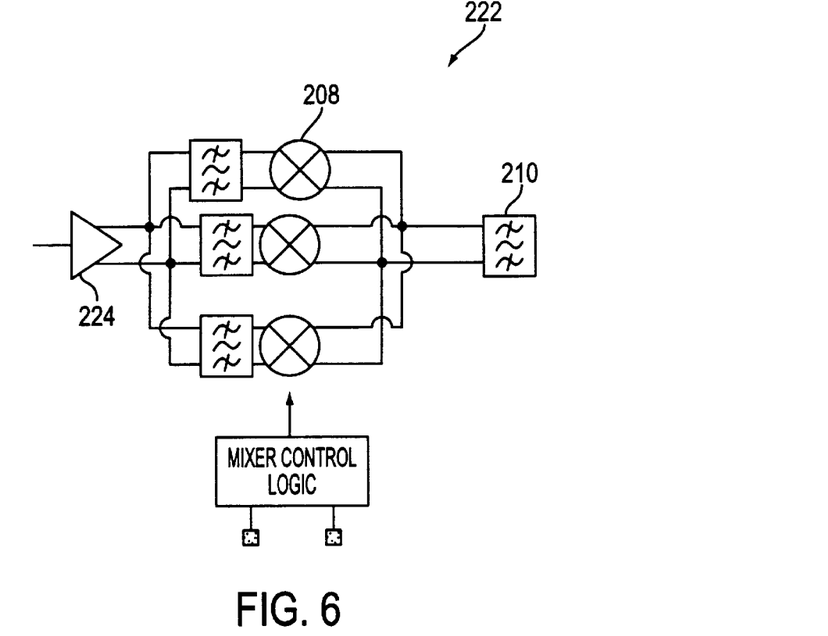
FIG. 6 is a more detailed schematic diagram of one embodiment of the present invention, wherein the upconverter includes a plurality of first mixers.
Figure 7:
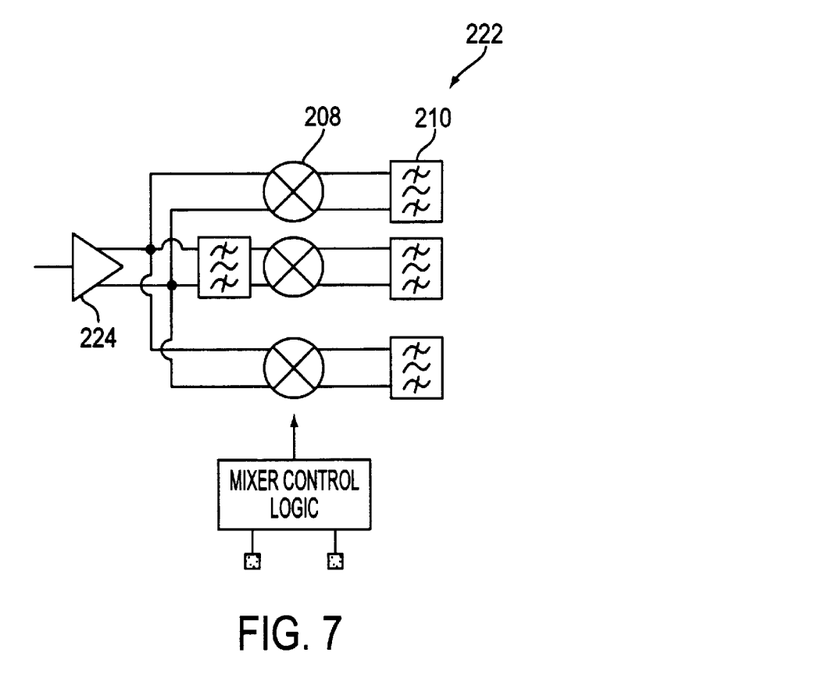
FIG. 7 is a more detailed schematic diagram of one embodiment of the present invention, wherein the upconverter includes a plurality of first mixers each with an associated filter.

Similar to the low noise amplifier 224 of the upconverter network 222, the variable attenuator 226 and first mixer 208 of the upconverter network 222 may each be variable in the sense that such components are adapted for adjustably setting a magnitude of the input signal. In yet another embodiment, the first mixer 208 of the upconverter network 222 may be replaced with two or more of the first mixers that are each suitable for converting a unique portion, or "sub-band", of the frequency range of the input signal. As shown in FIG. 6, the outputs of the mixers of the present embodiment are connected together. In use, such first mixers may be selectively enabled and disabled by way of an external pin of the integrated circuit 216. By this feature, the overall level of multiple carriers at the output of the mixers is reduced, improving the linear signal handling capability of the receiver. In yet another embodiment, the outputs of the aforementioned mixers each have a separate filter connected thereto for passing only frequencies which are outputted by the mixer connected thereto. Note FIG. 7. The separate filters are each configured to pass different frequencies. This in turn reduces the tuning range requirements of the variable controlled oscillator 272.

As mentioned earlier in reference to FIG. 2, the filter 210 acts as an intermediate frequency signal filter that may or may not be positioned on the integrated circuit 216 with the remaining components of the present invention. See FIGS. 3 and 4, respectively. Unlike prior art devices, this option is realized by mitigating the requirement for image rejection through conversion of the input signal directly to an output signal at a baseband frequency. By this feature, the filter 210 may include a simplistic L-C based filter that broadly filters the intermediate frequency signal and reduces the level of interference into the second mixers 214. In one embodiment, the filter 210 of the present invention may include spiral-metal-based inductors separate from the integrated circuit 216 and capacitors implemented on the integrated circuit 216.

With continuing reference to FIGS. 3–5, the embodiment of FIG. 2 may be further expanded to include a plurality of additional optional components for the purpose of enhanced operation. For instance, the second mixers 214 may be components of a downconverter network 240 that further includes a low noise amplifier 242 to improve the noise figure of the second mixers 214.

In operation, the second mixers 214 of the downconverter network 240 of the present invention are driven by the quadrature reference signals that are 90 degrees out-of-phase. The quadrature reference signals are in turn generated by the second reference signal that is tuned at the first intermediate frequency by means which will be set forth later. The output signals that are available at output terminals IOUT and QOUT are baseband outputs rather than traditional 44 or 36 MHz intermediate frequency outputs of the prior art.

It should be understood that since the output signals are at a baseband frequency, it is required that the receiver 200 of the present invention be coupled to a digital signal processor integrated circuit 244 specially tailored to accommodate the output signals at the output terminals. Examples of modifications include possible correction circuitry for rectifying quadrature errors that result from imperfections during the quadrature process. Specifically, such errors originate from the phase shifting network 212 as well as transistor-level mismatches in the circuitry of the second mixers 214. In previous systems the 44 or 36 MHz intermediate frequency does not require additional quadrature correcting processing since all quadrature demodulation is performed by the digital signal processor integrated circuit 244.

As an option, the low noise amplifier 242 of the downconverter network 240 may take the form of a variable low noise amplifier for adjustably setting a magnitude, or carrier levels, of the intermediate frequency signal. Such adjustability may be governed by a dedicated external pin of the integrated circuit 216. As yet another option, the second mixers 214 may take the form of variable mixers for adjustably setting a magnitude of the intermediate frequency signal. Similar to the low noise amplifier 242 of the downconverter network 240, the second mixers 214 may also be manipulated via a dedicated external pin of the integrated circuit 216.

As still yet another option, a baseband signal network 250 may be coupled to the outputs of the second mixers 214. As shown in FIGS. 3–5, such baseband signal network 250 includes a first pair of low noise amplifiers 252, a pair of low-pass filters 254, a second pair of low noise amplifiers 256, a gain offset correction circuit 258, and a DC offset correction circuit 262. The first pair of low noise amplifiers 252 are coupled between the second mixers 214 and the low-pass filters 254. Further, the second pair of low noise amplifiers 256 are coupled between the low-pass filters 254 and the gain offset correction circuit 258 which is in turn coupled to the outputs of the present invention. It is imperative that the elements along the output paths of the baseband signal network 250 are identical.

In operation, the first pair of low noise amplifiers 252 work to set a magnitude of the incoming carrier levels of the output signals such that the low-pass filters 254 operate within an optimum dynamic range, thus balancing noise and intermodulation performance. The purpose of the second pair of low noise filters 256, on the other hand, is to adjust a desired magnitude of the output signals required for analog-to-digital conversion in the subsequent digital signal processor integrated circuit 244.

The low-pass filters 254 are designed to reject adjacent carriers on the output signals while passing the desired carrier with minimum distortion. The bandwidth of the carriers, and therefore the bandwidth of the low-pass filters 254, is typically 3 MHz for a US cable system and 4 MHz for a European cable system. It should be noted, however, that other channel bandwidths may be present on the cable and therefore the filters may have different bandwidths. The low-pass filters 254 may be a $7^{th}$ order Elliptic design, and may contain a group delay equalization circuit to minimize distortion of the desired carrier. Other filter designs may be used which reduce the complexity of the filter circuitry and combine the filtering available in the subsequent digital signal processor integrated circuit 244 to provide the desired adjacent channel rejection.

Optionally, an external pin of the integrated circuit 216 of the present invention may be dedicated to allow adjustment of a common mode DC level of the differential outputs to suit the needs of the subsequent digital signal processor integrated circuit 244. In still other implementations, the outputs of the baseband signal network 250 may be single ended.

The gain offset correction circuit 258 operates to balance the magnitude of the output signals at the outputs IOUT and QOUT within 0.3 dB. This is critical for maximizing the utilization of the dynamic range of the analog-to-digital converter of the subsequent digital signal processor integrated circuit 244. During operation, the DC offset correction circuit 262 removes most of the DC offset present in the baseband signal network 250. It should be noted that the DC offset is due to self-conversion of the second reference signal in the downconverter network 240.

In various alternate embodiments, the first and second pair of amplifiers 252 and 256 of the baseband signal network 250 may be variable amplifiers, thus allowing for adjustable gain. As shown in FIGS. 3 and 4, such adjustability may be governed by a dedicated external pin on the integrated circuit 216 of the present invention. In the alternative, the gain may be adjusted via a serial bus, as shown in FIG. 5. Similarly, a cutoff frequency of the low-pass filters 254 may be adjustable by either a dedicated external pin or serial bus, as shown in FIGS. (3 and 4) and 5, respectively.

With continuing reference to FIGS. 3–5, it is shown that the first and second reference signal sources 204 and 206 each include a local oscillator network 270 having multiple components such as a variable controlled oscillator 272 and a frequency synthesizer 274. By way of example, the frequency synthesizer 274 may take the form of a dual phase locked loop, i.e. SP5848.

As an option, active circuitry of the variable controlled oscillators 272 may be implemented on the integrated circuit 216 of the present invention while a tank circuit 278, i.e. varactor diodes, inductors, and capacitors, is implemented on or separate from the integrated circuit 216. Further, one or both of the variable controlled oscillators 272 may be implemented on the integrated circuit 216. In use, the variable controlled oscillators 272 present low phase noise on the order of −85 dBc, at 10 kHz offset. As shown in FIG. 5, the dual phase locked loop may be included on the integrated circuit 216 and controlled by a serial interface. Finally, a means of providing the 30V supply to operate the varactors may also be included on chip.

Yet another component of the present invention includes an automatic gain control network 280 having a power detector 282 and an operational amplifier 284. As shown in FIGS. 3–5, the power detector 282 is connected between the output of the low noise amplifier 242 of the downconverter network 240 and a first input of the operational amplifier 284 of the automatic gain control network 280. Such first input of the operational amplifier 284 is further connected to an off-chip RC circuit 286 via an external pin 288. A second input and an output of the operational amplifier 284 are also accessible by way of external pins 290 and 292 and are connected via a feedback loop 294 and a corresponding resistor network 296. The output of the operational amplifier 284 is further connected to the variable attenuator 226 of the upconverter network 222 and the PIN attenuator network 220 for attenuating the magnitude of the incoming input signal when a certain detected power level is reached at the input of the downconverter network 240.

In use, the power detector 282 senses a level of total composite power of the intermediate frequency signal entering the downconverter network 240 and generates a corresponding current. This current is then filtered via the RC circuit 286. It should be noted that a resistor of the RC circuit 286 converts the current into a voltage which in turn determines the detected power level vs. voltage. A capacitor of the RC circuit 286 sets the dominant pole in the loop. The resulting voltage is present at the first input of the operational amplifier 284, as shown in FIGS. 3–5. The second input of the operational amplifier 284 is connected to a passive feedback configuration to set a desired loop gain. In this configuration, a first resistor 300 of the feedback loop 294 is connected in the feedback loop 294 and a second resistor 302 of the feedback loop 294 is connected to ground.

The operational amplifier 284 of the automatic gain control network 280 thus drives the PIN attenuator network 220 such that the present invention operates in a self-regulating mode. In particular, this is accomplished by the PIN attenuator network 220 attenuating a magnitude of the incoming input signal when a certain power level is reached at the input of the downconverter network 240. This is critical for preventing the downconverter network 240 from becoming overloaded. In various alternate embodiments, the automatic gain control network 280 may be used to control the amplifiers or mixers of either the upconverter network 222 or downconverter network 240.

Finally, a digital serial interface 310 may be provided for allowing the digital signal processor integrated circuit 244 or a microcontroller to control the receiver 200. As shown in FIG. 5, a 2- or 3-wire serial digital interface may be employed.

Figure 8A:
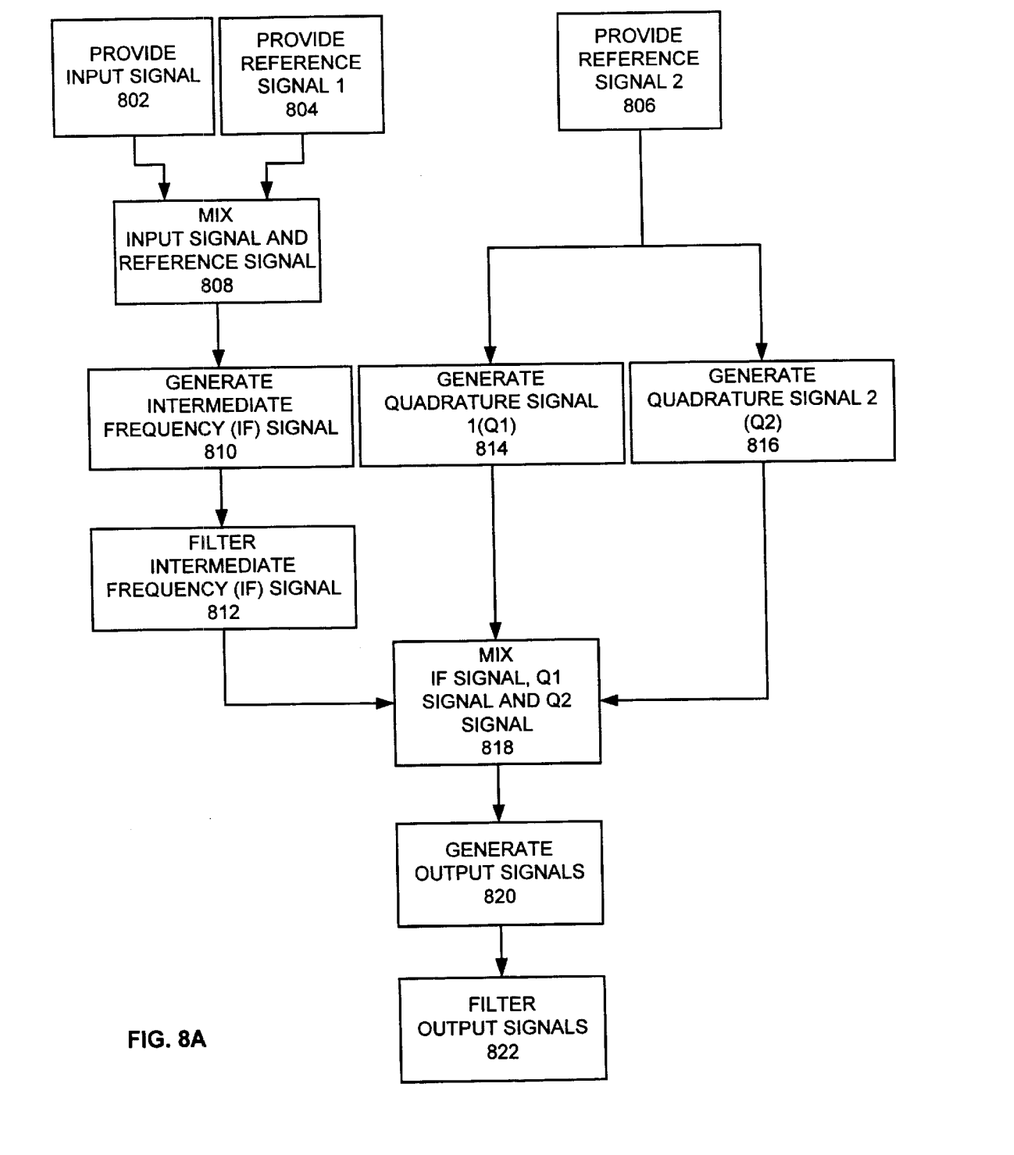
FIGS. 8A through 8G are flowcharts of embodiments of the invention showing methods for tuning a receiver.

Having described embodiments of the invention and their operation, methods of the invention as shown in the flowcharts of FIGS. 8A through D can now be better understood. Shown in FIG. 8A is a method of tuning a receiver. As shown in FIG. 8A, an input signal, a first reference signal and a second reference signal are provided at steps 802, 804 and 806, respectively. The input signal provided at step 802 is at a predetermined frequency range. Moreover, the input signal includes at least one of a broadcast television signal, a cable television signal and a digital signal transmitted over a cable delivery signal. The first reference signal has a first. operating frequency and the second reference signal has a second operating frequency. At step 808, the first reference signal and the input signal are mixed to generate, at step 810, an intermediate frequency (IF) signal. The intermediate frequency signal has a frequency greater than at least one frequency in the predetermined frequency range. The intermediate frequency signal is then filtered at step 812. From the second reference signal, a pair of quadrature reference signals, Q1 and Q2, are generated at steps 814 and 816, respectively. The pair of quadrature reference signals, Q1 and Q2, have a frequency substantially equal to the second operating frequency. At step 818, the pair of quadrature signals, Q1 and Q2, and the intermediate frequency signal are mixed to generate output signals at step 820. The output signals are in quadrature and at a baseband frequency. At step 822, the output signals are filtered.

In another embodiment of the invention, the input signal includes at least one of the televisions signals. Also, the input signal can include the digital data signal. In an embodiment of the invention, the steps 808, 810 and 814 through 822 are executed on a single integrated circuit. In another embodiment, the step 812 is also executed on the integrated circuit. In yet another embodiment, the step 812 is carried out off the integrated circuit. The step of 812 can also be carried out using spiral-metal-based inductors and capacitors.

Figure 8B:
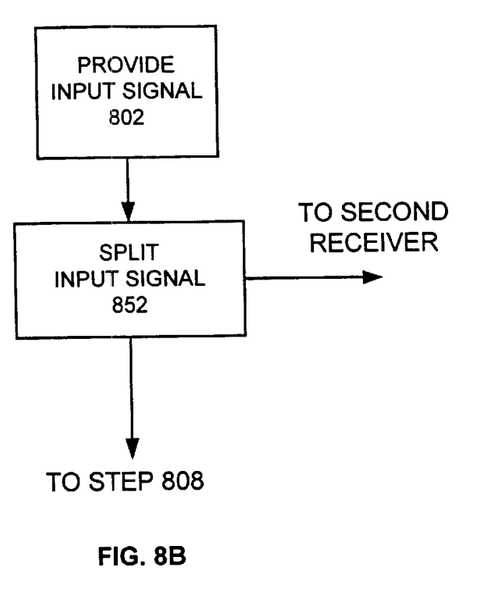
Figure 8C:
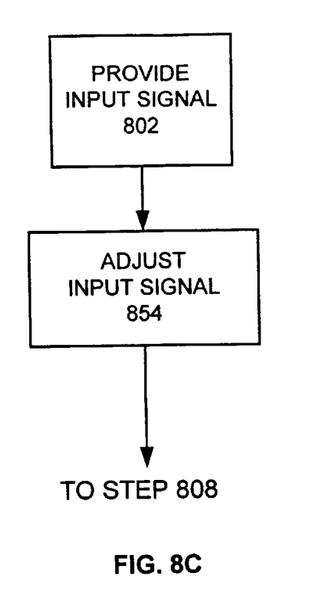
Figure 8D:
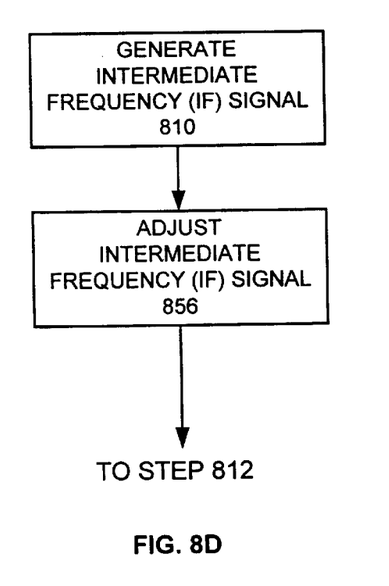
Figure 8E:
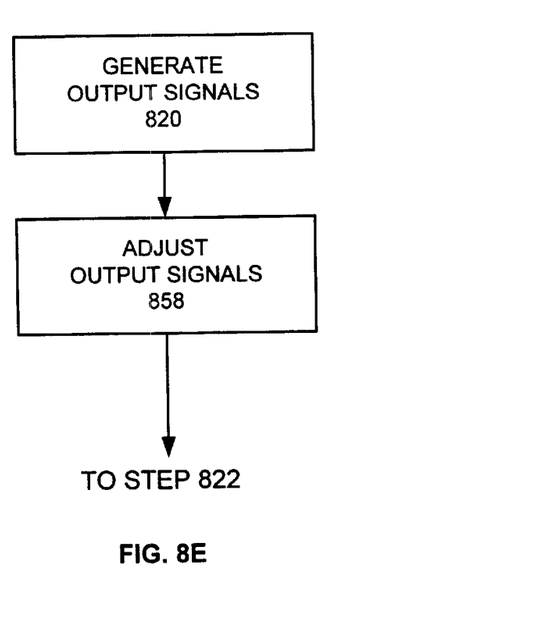
Figure 8F:
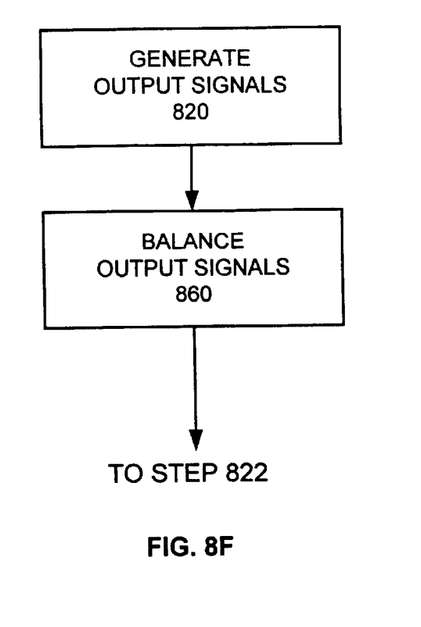
Figure 8G:
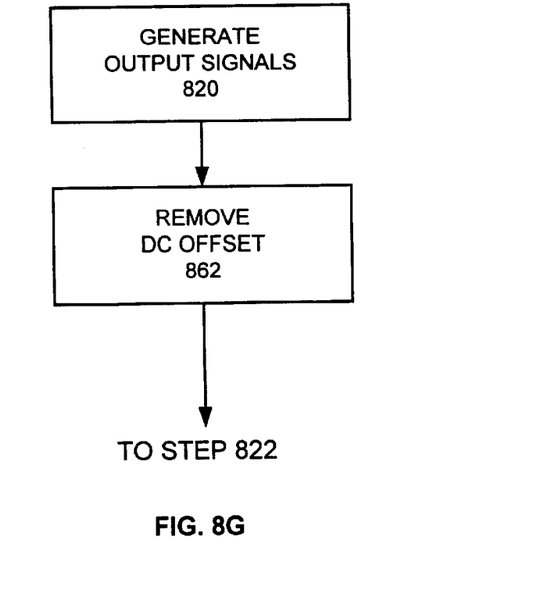

Shown in FIG. 8B is an embodiment of the invention, wherein the input signal is split at a further step 852 to provide a first split signal for carrying out step 808 and further provides a second split signal which can be provided to a second receiver. Shown in FIG. 8C is a further step 854 where the magnitude of the input signal is adjustably set. Step 808 and subsequent steps are then executed as previously described. As the input signal can be adjustably set, so can the magnitude of the intermediate reference signal be adjustably set at step 856 of FIG. 8D. Similarly, the magnitude of the output signals can be adjustably set at step 858 of FIG. 8E. Subsequent steps are carried out as previously described. Moreover, as shown in FIG. 8F, the output signals can be balanced at step 860 within a predetermined difference in preparation for analog to digital conversion. As shown in FIG. 8G, DC offset in the output signals is removed at step 862 in preparation for analog to digital conversion. Again, all other steps are carried out as previously described. The steps of the various methods of the invention can be modified as would be obvious to one of skill in the art without deviating from the teachings of the invention.

Figure 9:
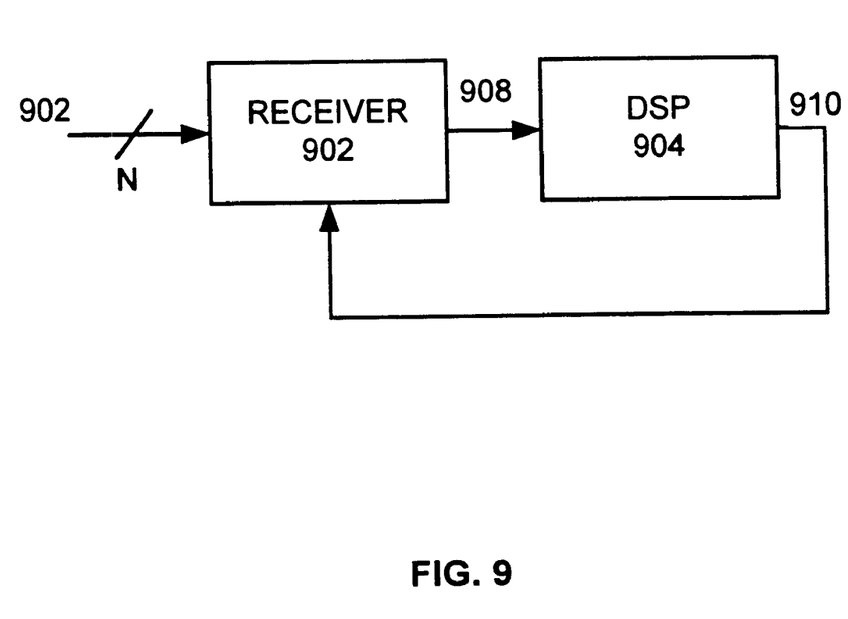
FIG. 9 is a block diagram of one embodiment of the invention, wherein a receiver is connected to a digital signal processor (DSP).

FIG. 9 is a block diagram of yet another embodiment of the invention depicting the receiver 902 described for the method of FIGS. 8A through 8G that is connected to a digital signal processor (DSP) 904. Receiver 902 receives signals 906 as described for FIGS. 8A through 8G and provides signals 908 to DSP 904. In operation, DSP 904 provides feedback signal 910 which control the receiver 902.

As to the manner of usage and operation of the present invention, the same should be apparent from the above description. Accordingly, no further discussion relating to the manner of usage and operation will be provided.

Although only a few embodiments of the present invention have been described in detail herein, it should be understood that the present invention could be embodied in many other specific forms without departing from the spirit or scope of the invention.

Therefore, the present examples and embodiments are to be considered as illustrative and not restrictive, and the invention is not to be limited to the details given herein, but may be modified within the scope of the appended claims.

I claim:

1. A receiver for use with an input signal that takes the form of at least one of a broadcast television signal, a cable television signal, and a digital signal transmitted over a cable delivery system, comprising:

a first mixer including a first input adapted for receiving an input signal in a predetermined frequency range, the first mixer further including a second input adapted for receiving a first reference signal having a first operating frequency, the first mixer suitable for outputting at an output thereof an intermediate frequency signal having a frequency greater than at least one frequency in the predetermined frequency range;

a filter for filtering the intermediate frequency signal;

a phase shifting network including an input adapted for receiving a second reference signal having a second operating frequency, the phase shifting network further including a pair of outputs, the phase shifting network suitable for outputting at the outputs thereof a pair of quadrature reference signals each having a frequency substantially equal to the second operating frequency;

a pair of second mixers each having a first input coupled to the filter and a second input coupled to one of the outputs of the phase shifting network, the second mixers suitable for outputting at outputs thereof output signals that are in quadrature and at a baseband frequency; and a pair of low-pass filters coupled to the second mixers for filtering the output signals.

2. The receiver as set forth in claim 1, wherein the input signal includes at least one of the television signals.

3. The receiver as set forth in claim 1, wherein the input signal includes the digital signal.

4. The receiver as set forth in claim 1, wherein the first mixer, the second mixers and the phase shifting network are each implemented on an integrated circuit.

5. The receiver as set forth in claim 4, wherein at least one of the filters is implemented on the integrated circuit.

6. The receiver as set forth in claim 5, wherein at least one of the filters includes spiral-metal-based inductors and capacitors.

7. The receiver as set forth in claim 1, wherein the first mixer is a component of an upconverter network that further includes an amplifier and an image filter.

8. The receiver as set forth in claim 7, wherein the amplifier includes a separate output for serving as a signal splitter and driving a second receiver.

9. The receiver as set forth in claim 7, wherein the amplifier is coupled to a variable attenuator for adjustably setting a magnitude of the input signal.

10. The receiver as set forth in claim 7, wherein the amplifier is a variable amplifier for adjustably setting a magnitude of the input signal.

11. The receiver as set forth in claim 1, wherein the first mixer is a variable mixer for adjustably setting a magnitude of the input signal.

12. The receiver as set forth in claim 1, wherein a plurality of first mixers are included each suitable for outputting an intermediate frequency signal having a frequency within a unique predetermined frequency range.

13. The receiver as set forth in claim 1, wherein the second mixers are components of a downconverter network that further includes an amplifier.

14. The receiver as set forth in claim 13, wherein the amplifier is a variable amplifier for adjustably setting a magnitude of the intermediate frequency signal.

15. The receiver as set forth in claim 1, wherein the second mixers are variable mixers for adjustably setting a magnitude of the intermediate frequency signal.

16. The receiver as set forth in claim 1, wherein a baseband signal network is coupled to the outputs of the second mixers, the baseband signal network including the pair of low-pass filters.

17. The receiver as set forth in claim 16, wherein a cutoff frequency of each of the low-pass filters is adjustable.

18. The receiver as set forth in claim 16, wherein the baseband signal network includes a pair of amplifiers coupled to inputs of the lowpass filters for adjusting a magnitude of the output signals such that the low-pass filters of the baseband signal network operate within a predetermined range.

19. The receiver as set forth in claim 18, wherein the amplifiers of the baseband signal network are variable amplifiers.

20. The receiver as set forth in claim 16, wherein the baseband signal network includes a pair of amplifiers coupled to outputs of the low-pass filters for adjusting a magnitude of the output signals in preparation for analog to digital conversion.

21. The receiver as set forth in claim 20, wherein the amplifiers of the baseband signal network are variable amplifiers.

22. The receiver as set forth in claim 16, wherein the baseband signal network includes a gain offset correction circuit for balancing the output signals within a predetermined difference in preparation for analog to digital conversion.

23. The receiver as set forth in claim 16, wherein the baseband signal network includes a DC offset correction circuit for removing a DC offset in the output signals in preparation for analog to digital conversion.

24. The receiver as set forth in claim 1, wherein the reference signals are generated by oscillator circuits each including a variable controlled oscillator and a frequency synthesizer circuit.

25. The receiver as set forth in claim 24, wherein the first mixer, the second mixers, the phase shifting network, and at least a portion of the variable controlled oscillator of each of the oscillator circuits is implemented on an integrated circuit.

26. The receiver as set forth in claim 24, wherein the first mixer, the second mixers, the phase shifting network, and at least a portion of the frequency synthesizer circuit of each of the oscillator circuits is implemented on an integrated circuit.

27. The receiver as set forth in claim 13, and further including an automatic gain control circuit having a power detector and an amplifier.

28. The receiver as set forth in claim 27, wherein the amplifier of the automatic gain control circuit is coupled to the amplifier of the downconverter network for controlling purposes.

29. The receiver as set forth in claim 27, wherein the amplifier of the automatic gain control circuit is coupled to the first mixer of the downconverter network for controlling purposes.

30. The receiver as set forth in claim 7, and further including an automatic gain control circuit having a power detector and an amplifier.

31. The receiver as set forth in claim 30, wherein the amplifier of the automatic gain control circuit is coupled to the amplifier of the upconverter network for controlling purposes.

32. The receiver as set forth in claim 30, the amplifier of the automatic gain control circuit is coupled to the first mixer of the upconverter network for controlling purposes.

33. The receiver as set forth in claim 1, and further including a digital signal processor coupled to the second mixers, the digital signal processor being suitable for accepting the output signals that are at the baseband frequency.

34. The receiver as set forth in claim 33, and further including a digital serial interface for allowing the digital signal processor to control the receiver.

35. The receiver as set forth in claim 1, wherein a plurality of the first mixers are included each for receiving input signals in a portion of the predetermined range.

36. The receiver as set forth in claim 35, wherein the first mixers are selectively enabled and disabled.

37. The receiver as set forth in claim 35, wherein each of the first mixers has a separate filter connected thereto.

38. A method of tuning a receiver comprising the operations of:

provided an input signal in a predetermined frequency range, wherein the input signal includes at least one of a broadcast television signal, a cable television signal, and a digital signal transmitted over a cable delivery system;

providing a first reference signal having a first operating frequency;

providing a second reference signal having a second operating frequency;

mixing the first reference signal and the input signal to generate an intermediate frequency signal having a frequency greater than at least one frequency in the predetermined frequency range;

filtering the intermediate frequency signal;

generating from the second reference signal a pair of quadrature reference signals each having a frequency substantially equal to the second operating frequency;

mixing the quadrature signals and the intermediate frequency signal to generate output signals that are in quadrature and at a baseband frequency; and filtering the output signals.

39. The method as set forth in claim 38, wherein the input signal includes at least one of the television signals.

40. The method as set forth in claim 38, wherein the input signal includes the digital data signal.

41. The method as set forth in claim 38, wherein the operations of mixing the first reference signal and the input signal, generating from the second reference signal a pair of quadrature reference signals, mixing the quadrature signals and the intermediate frequency signal, and filtering the output signals each are executed on a single integrated circuit.

42. The method as set forth in claim 41, wherein the operation of filtering the intermediate frequency signal is executed on the integrated circuit.

43. The method as set forth in claim 41, wherein the operation of filtering the intermediate frequency signal is carried out off the integrated circuit.

44. The method as set forth in claim 42, wherein the operation of filtering the intermediate frequency signal is carried out using spiral-metal-based inductors and capacitors.

45. The method as set forth in claim 38, and further including the operation of:

splitting the input signal for tuning a second receiver.

46. The method as set forth in claim 38, and further including the operation of:

adjustably setting a magnitude of the input signal.

47. The method as set forth in claim 38, and further including the operation of:

adjustably setting a magnitude of the intermediate frequency signal.

48. The method as set forth in claim 38, and further including the operation of:

adjusting a magnitude of the output signals in preparation for analog to digital conversion.

49. The method as set forth in claim 38, and further including the operation of:

balancing the output signals within a predetermined difference in preparation for analog to digital conversion.

50. The method as set forth in claim 38, and further including the operation of:

removing a DC offset in the output signals in preparation for analog to digital conversion.

51. The method as set forth in claim 38, and further including the operation of:

connecting the receiver to a digital signal processor which controls the receiver.

52. A receiver for use with an input signal that takes the form of at least one of a broadcast television signal, a cable television signal, and a digital signal transmitted over a cable delivery system, comprising:

a first mixer means including a first input adapted for receiving an input signal in a predetermined frequency range, the first mixer means further including a second input adapted for receiving a first reference signal having a first operating frequency, the first mixer means suitable for outputting at an output thereof an intermediate frequency signal having a frequency greater than at least one frequency in the predetermined frequency range;

a filter means for filtering the intermediate frequency signal;

a phase shifting network means including an input adapted for receiving a second reference signal having a second operating frequency, the phase shifting network means further including a pair of outputs, the phase shifting network means suitable for outputting at the outputs thereof a pair of quadrature reference signals each having a frequency substantially equal to the second operating frequency;

a pair of second mixer means each having a first input coupled to the filter means and a second input coupled to one of the outputs of the phase shifting network means, the second mixer means suitable for outputting at outputs thereof output signals that are in quadrature and at a baseband frequency; and at least one low-pass filter means coupled to the second mixer means for filtering the output signals.

* * * * *